United States Patent
Kang et al.

(10) Patent No.: US 8,208,317 B2
(45) Date of Patent: Jun. 26, 2012

(54) SEMICONDUCTOR MEMORY DEVICE

(75) Inventors: Sang-Seok Kang, Suwon-si (KR); Hyung-Dong Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 377 days.

(21) Appl. No.: 12/461,277

(22) Filed: Aug. 6, 2009

(65) Prior Publication Data

US 2010/0034031 A1 Feb. 11, 2010

(30) Foreign Application Priority Data

Aug. 6, 2008 (KR) .................. 10-2008-0076962

(51) Int. Cl.
*G11C 5/14* (2006.01)
*G11C 7/00* (2006.01)
*G11C 7/02* (2006.01)

(52) U.S. Cl. ............ 365/189.09; 365/222; 365/207; 365/226

(58) Field of Classification Search ............ 365/189.09, 365/222, 207, 226
See application file for complete search history.

(56) References Cited

U.S. PATENT DOCUMENTS

| 5,812,475 | A | * | 9/1998 | Lee et al. ............... 365/222 |
| 6,026,043 | A | | 2/2000 | Suzuki |
| 6,603,695 | B2 | * | 8/2003 | Mitsui ................... 365/222 |
| 7,379,369 | B2 | * | 5/2008 | Lee ...................... 365/222 |
| 2007/0153611 | A1 | | 7/2007 | Lee |

FOREIGN PATENT DOCUMENTS

| JP | 10-055667 A | 2/1998 |
| JP | 11-086548 A | 3/1999 |
| KR | 10-2001-0052050 A | 6/2001 |
| KR | 10-2007-0070813 A | 7/2004 |

* cited by examiner

*Primary Examiner* — Alexander Sofocleous
*Assistant Examiner* — Hai Pham
(74) *Attorney, Agent, or Firm* — Lee & Morse, P.C.

(57) ABSTRACT

A semiconductor memory device includes a voltage level selection unit configured to output a plurality of voltage level selection signals according to a fuse program in response to a self-refresh command signal and a reference voltage generator configured to receive a reference voltage and output a target reference voltage having a different voltage level depending on a normal mode or a self-refresh mode in response to the voltage level selection signals.

17 Claims, 9 Drawing Sheets

SEMICONDUCTOR MEMORY DEVICE

BACKGROUND

1. Field

Example embodiments relate to a semiconductor memory device, and more particularly, to a semiconductor memory device capable of increasing a self-refresh period during a self-refresh operation so as to reduce power consumption.

2. Description of the Related Art

In general, a memory cell of a semiconductor memory device may include, e.g., a NMOS transistor. Since the NMOS transistor may include a leakage current component, the semiconductor memory device may need to periodically restore data stored in the memory cell before the data is erased due to the leakage current.

The operation of periodically restoring data in the memory cell may be typically called a refresh operation. Especially, in a self-refresh operation, addresses for memory cells may be sequentially generated in a semiconductor memory device without using externally generated addresses used to address memory cells during a normal operation.

SUMMARY

Embodiments are therefore directed to a semiconductor memory device capable of increasing a self-refresh period during a self-refresh operation, which substantially overcomes one or more of the problems due to the limitations and disadvantages of the related art.

It is therefore a feature of an embodiment to provide a semiconductor memory device capable of increasing a self-refresh period by varying voltage levels of a substrate voltage and a reference voltage according to a normal mode and a self-refresh mode.

At least one of the above and other features and advantages may be realized by providing a semiconductor memory device, including a voltage level selection unit configured to output a plurality of voltage level selection signals according to a fuse program in response to a self-refresh command signal, and a reference voltage generator configured to receive a reference voltage and output a target reference voltage having a different voltage level depending on a steady mode or a self-refresh mode in response to the voltage level selection signals.

The semiconductor memory device may further include a substrate voltage generator configured to pump charges until a substrate voltage reaches a target substrate voltage level according to the steady mode or the self-refresh mode in response to the voltage level selection signals and generate a substrate voltage having a different voltage level.

The semiconductor memory device may further include a cell transistor having a bulk terminal to which the substrate voltage is applied, a gate terminal connected to a word line, and a first terminal connected to a bit line, and a cell capacitor having a first terminal connected to a second terminal of the cell transistor and a second terminal to which a cell plate voltage generated using the target reference voltage is applied.

In the self-refresh mode, the semiconductor memory device may output a higher target reference voltage and a lower substrate voltage than in the normal mode, i.e., a steady mode.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2008-0076962, filed on Aug. 6, 2008, in the Korean Intellectual Property Office, and entitled: "Semiconductor Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when an element is referred to as being "between" two elements or "connected to" another element, it can be the only element between two elements or connected to another element, or one or more intervening elements may also be present. Like reference numerals refer to like elements throughout.

Figure 1:
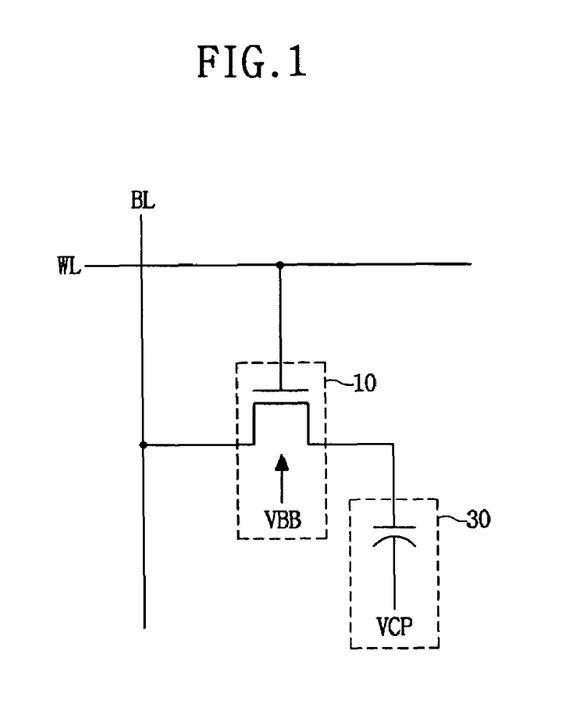
FIG. 1 illustrates a schematic diagram of a memory cell of a semiconductor memory device.

FIG. 1 illustrates a schematic diagram of a memory cell of a semiconductor memory device. As illustrated in FIG. 1, the memory cell may include a cell transistor 10 and a cell capacitor 30. Operation of the memory cell of the semiconductor memory device will now be described with reference to FIG. 1.

Referring to FIG. 1, the cell transistor 10 may include a NMOS transistor having a bulk terminal to which a substrate voltage VBB is applied. The cell transistor 10 may connect a bit line BL with the cell capacitor 30 in response to a voltage of a word line WL applied to a gate terminal thereof.

The cell capacitor 30 may perform an operation of sharing charges with the bit line BL through the cell transistor 10 connected to a first terminal thereof to write or read data. A second terminal of the cell capacitor 30 may be connected to a cell plate voltage VCP to reduce a difference in electrical field between two electrodes.

A general semiconductor memory device may include a memory cell array, a peripheral logic for controlling a row address or a column address required for finding an effective address in the memory cell array, and power circuits for maintaining electrical states of the memory cell array and the peripheral logic. Control of the power circuits may affect standby power of the semiconductor memory device.

For example, when the semiconductor memory device enters into a standby mode, i.e., a self-refresh mode, only absolutely required external signals may be maintained. In other words, blocks connected to other external connection pins may enter into an "off" mode, so that power circuits required for internally maintaining an operating state may become main power-consuming elements.

Main power circuits may include a substrate voltage generation circuit, i.e., a circuit configured to generate a bulk bias voltage of the memory cell array, a boost voltage generation circuit, i.e., a circuit configured to enable a word line of the memory cell array, and an internal power supply voltage generation circuit, i.e., a circuit configured to receive an external power supply voltage and apply internal power supply voltage to blocks requiring specific voltage levels.

As shown in FIG. 1, the substrate voltage generation circuit may generate a substrate voltage VBB, e.g., a negative power voltage applied to a P-well of the memory cell of the semiconductor memory device. In this case, a leakage current may occur in the memory cell due to a difference in electrical potential between both terminals of a PN junction.

That is, the cell transistor 10 including the NMOS transistor may receive the substrate voltage VBB through the bulk terminal and connect the bit line BL with the cell capacitor 30 in response to a voltage of the word line WL applied to the gate terminal thereof. In this case, as the absolute value of the substrate voltage VBB applied to an N region, i.e., the NMOS transistor, increases, a potential difference between both terminals of the PN junction may also increase, so that the junction leakage current may also increase. As a large current may be consumed due to a high-speed operation in a normal mode, while a small current may be consumed in a self-refresh mode, application of a same substrate voltage VBB during both the normal mode and the self-refresh may unnecessarily increase leakage current. As such, use of a same substrate voltage VBB during both the normal mode and the self-refresh may increase power consumption. That is, control of the substrate voltage VBB may affect the self-refresh period.

In most mobile semiconductor memory devices a self-refresh period may be increased to decrease leakage current components of a memory cell array and to reduce a self-refresh current IDD, e.g., a self-refresh period may be about twice as long as described in the specification or more. For example, attempts have been made to reduce the self-refresh current IDD by reducing a direct-current (DC) voltage, e.g., an internal power supply voltage or a boost voltage, or a current level by increasing a length of a transistor or reducing a linewidth.

Control of a reference voltage may affect the self-refresh period, too. Most semiconductor memory devices adopt reference voltage generation circuits, which generate the reference voltage to generate an internal voltage serving as a power supply in a semiconductor memory device for maintaining a bias voltage in a standby mode.

For example, referring to FIG. 1, an internal voltage having a voltage level of, e.g., about 0 V or about Vcc/2, may be used as the cell plate voltage VCP applied to the cell capacitor 30. However, as leakage current between the transistor 10 and the capacitor 30 increases, charge loss Q caused by the leakage current of the cell capacitor 30 may increase without a refresh operation according to $Q=i*tREF$. Here, tREF denotes a refresh period.

For example, each time a memory capability of a semiconductor memory device increases by about four times, a maximum refresh period increases by about two times, so that the leakage current of a memory cell needs to decrease by about half. That is, an increase of a reference voltage required to generate the cell plate voltage VCP, i.e., the internal voltage, may increase a number of charges Q in the cell capacitor 30. Therefore, the maximum refresh period, which is proportional to the number of charges of the cell capacitor 30 based on the equation $tREF=Q/i$, may also increase. As a result, the increased maximum refresh period tREF may be used to increase a self-refresh period in order to reduce a self-refresh current IDD.

Figure 2:
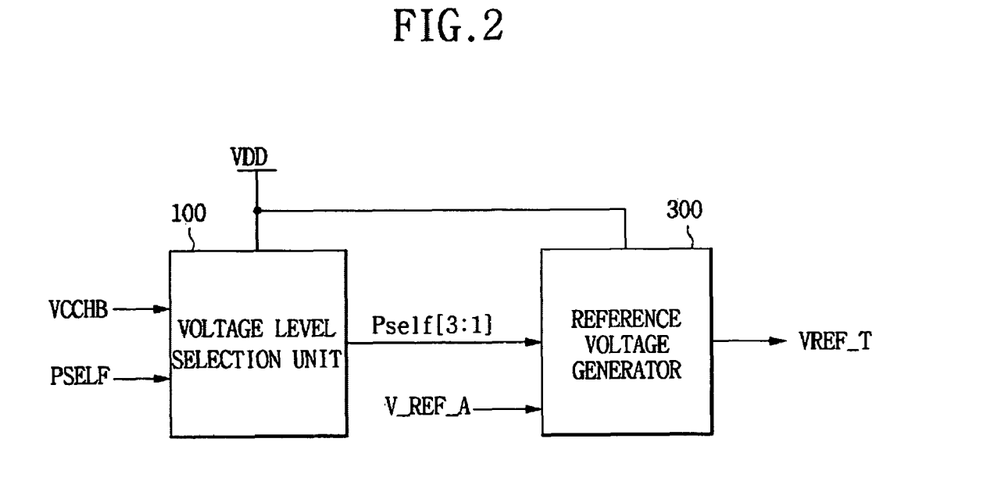
FIG. 2 illustrates a block diagram of a portion of a semiconductor memory device according to an example embodiment.

FIG. 2 illustrates a block diagram of a portion of a semiconductor memory device according to an example embodiment. The semiconductor memory device may include a voltage level selection unit 100 and a reference voltage generator 300. Functions of some blocks of a semiconductor memory device according to an example embodiment will now be described with reference to FIG. 2.

Referring to FIG. 2, the voltage level selection unit 100 may receive a power-up signal VCCHB and a self-refresh command signal PSELF, and may output a plurality of corresponding voltage level selection signals Pself, e.g., voltage level selection signals Pself[3:1]. The voltage level selection signals Pself[3:1] may be input into the reference voltage generator 300, so a corresponding voltage level of a target reference voltage VREF_T may be adjusted with respect to a normal mode and a self-refresh mode according to a fuse program.

That is, the reference voltage generator 300 may receive an external power supply voltage VDD and may output different target reference voltages VREF_T according to the normal mode or the self-refresh mode in response to the plurality of voltage level selection signals Pself[3:1]. A detailed operation of the voltage level selection unit 100 and the reference voltage generator 300 will be described in more detail below with reference to FIGS. 3 and 4, respectively.

Figure 3:
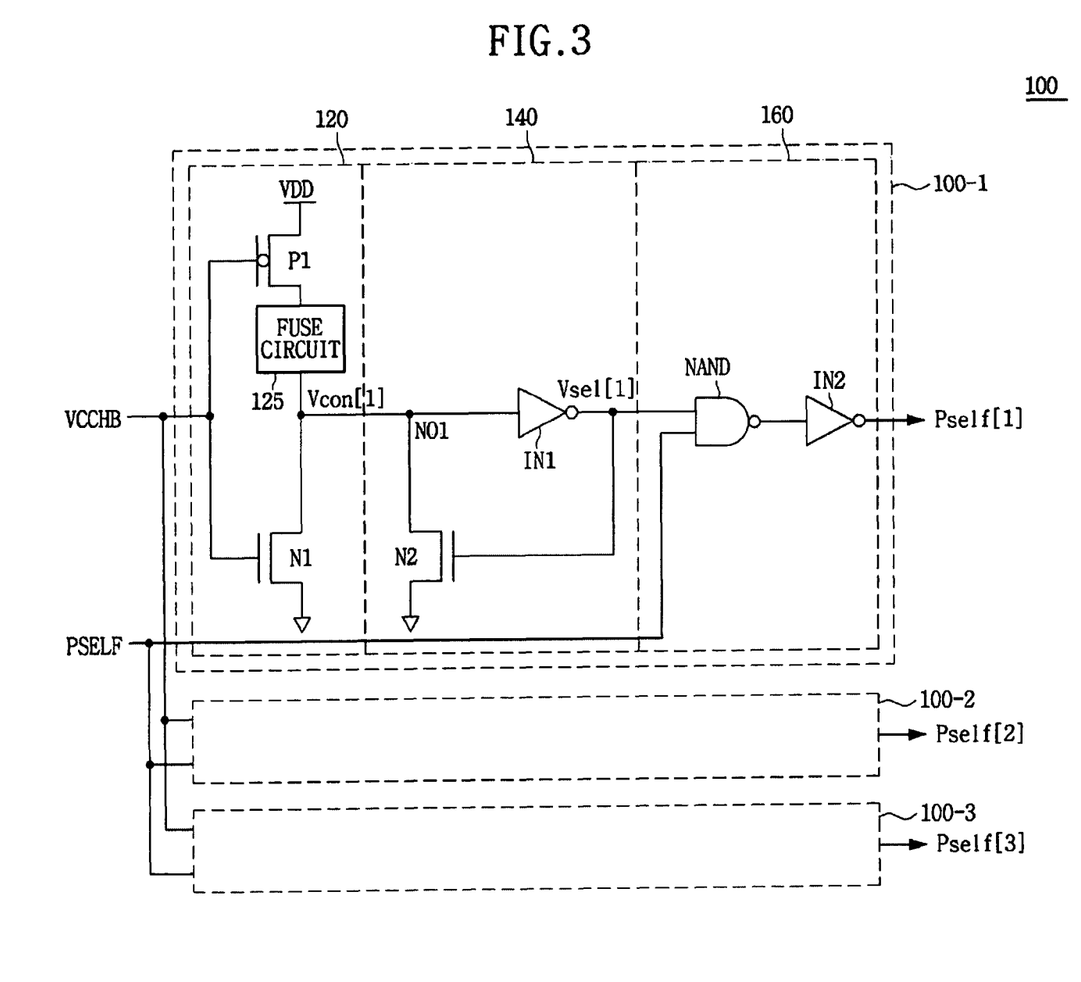
FIG. 3 illustrates a circuit diagram of a voltage level selection unit of the semiconductor memory device shown in FIG. 2.

FIG. 3 illustrates a circuit diagram of the voltage level selection unit 100 of the semiconductor memory device shown in FIG. 2. The voltage level selection unit 100 may be configured to include a plurality of voltage level selectors, e.g., voltage level selectors 100-1 to 100-3. Each voltage level selector may include a voltage level controller 120, a latch unit 140, and an operating mode selector 160.

As illustrated in FIG. 3, the voltage level controller 120 may include a first PMOS transistor P1. Terminals of the first PMOS transistor P1 may be connected between an external power supply voltage VDD and a fuse circuit 125, and a gate terminal of the first PMOS transistor P1 may be applied with a power-up signal VCCHB. The voltage level controller 120 may further include the fuse circuit 125, which may be connected between the first PMOS transistor P1 and a node N01, and a first NMOS transistor N1, which may be connected between the node N01 and a ground voltage and may have a gate terminal applied by the power-up signal VCCHB. The fuse circuit 125 may output a voltage level control signal Vcon to the node N01, e.g., a voltage level control signal Vcon[1] corresponding to a voltage level selector 100-1, so occurrence of a blown-off fuse according to a fuse program in the fuse circuit 125 may be indicated via the voltage level control signal Vcon.

As further illustrated in FIG. 3, the latch unit 140 may include a first inverter IN1 which inverts a signal of the node N01, e.g., the voltage level control signal Vcon[1], and outputs a selection control signal Vsel, e.g., a selection control signal Vsel[1] corresponding to the voltage level control signal Vcon[1]. The latch unit 140 may further include a second NMOS transistor N2 which may be connected between the node N01 and a ground voltage. An output signal of the first inverter IN1, e.g., the selection control signal Vsel[1], may be applied to a gate terminal of the second NMOS transistor N2.

As further illustrated in FIG. 3, the operating mode selector 160 may include a NAND gate NAND. The NAND gate NAND may receive and perform a logic NAND operation on the selection control signal Vsel[1] and a self-refresh command signal PSELF, and may output the logic NAND operation result into a second inverter IN2. The second inverter IN2 inverts the output signal of the NAND gate NAND and outputs a voltage level selection signal Pself, e.g., a voltage level selection signal Pself[1] corresponding to the selection control signal Vsel[1].

Functions of respective blocks of the voltage level selection unit 100 will now be described with reference to FIG. 3. In the present example embodiment, it is assumed for brevity that the voltage level selector unit 100 includes only three voltage level selectors 100-1 to 100-3 and outputs three voltage level selection signals self[3:1], and that the fuse circuit 125 of the voltage level controller 120 includes only one fuse to enable a total of eight programs. The present example embodiment will now be described in detail with reference to the first voltage level selector 100-1.

Referring to FIG. 3, the voltage level controller 120 of the voltage level selector 100-1 may receive a power supply voltage VDD and may output a voltage level control signal Vcon[1], which may be determined by fuse programming of the fuse circuit 125 in accordance with a predetermined voltage level. The latch unit 140 of the voltage level selector 100-1 may receive and latch the voltage level control signal Vcon[1], and may output a corresponding selection control signal Vsel[1] in response to the voltage level control signal Vcon[1]. The operating mode selector 160 of the voltage level selector 100-1 may output the voltage level selection signal Pself[1] in response to the selection control signal Vsel[1] and the self-refresh command signal PSELF.

Operation of the voltage level selector 100-1 of the voltage level selection unit 100 of the semiconductor memory device according to the present example embodiment will now be described with reference to FIG. 3.

The power-up signal VCCHB may be input into the voltage level controller 120. The power-up signal VCCHB may remain at a logic high level during an initial stage of a power-up operation to turn on the PMOS transistor P1 and the NMOS transistor N1. Therefore, while the power-up operation is performed, the voltage level controller 120 may output the voltage level control signal Vcon[1] at a low logic level to the note N01.

The latch unit 140 may latch the voltage level control signal Vcon[1] at the low logic level. That is, the first inverter IN1 may output the selection control signal Vsel[1] of a high logic level in response to the voltage level control signal Vcon[1] of the low logic level, and the second NMOS transistor N2 may be turned on in response to the selection control signal Vsel[1] of the high level, so a voltage at the node N01 may be latched at the low logic level.

When the power-up operation is completed, the power-up signal VCCHB may make a high-to-low transition, i.e., may be input into the voltage level controller 120 at a logic low. Therefore, the voltage level controller 120 may output the voltage level control signal Vcon[1] according to a fuse program of the fuse circuit 125, and the latch unit 140 may output the selection control signal Vsel[1] in response to the voltage level control signal Vcon[1].

That is, when a fuse (not shown) of the fuse circuit 125 is blown, a terminal to which the voltage level control signal Vcon[1] of the voltage level controller 120 is output may be floated. Therefore, a voltage of the node N01 may maintain a low level by operation of the latch unit 140, and the latch unit 140 may output the selection control signal Vsel[1] of a high level. When the fuse of the fuse circuit 125 is not blown, the voltage level controller 120 may output the voltage level selection signal Vcon[1] of a high level in response to the power-up signal VCCHB of the low level, and the latch unit 140 may output the selection control signal Vsel[1] of a low level in response to the voltage level selection signal Vcon[1] of the high level.

In the operating mode selector 160, the NAND gate NAND may receive the selection control signal Vsel[1] and the self-refresh command signal PSELF, and may perform a logic NAND operation on the received signals and output a corresponding logic NAND operation result. The second inverter IN2 may receive and invert the logic NAND operation result, and may output a voltage level selection signal Pself[1].

That is, in the normal mode, the self-refresh command signal PSELF input into the NAND gate NAND of the mode selector 160 is at a low logic level, so the operation mode selector 160 may output a voltage level selection signal Pself[1] of a low logic level regardless of the fuse program of the fuse circuit 125, i.e., regardless of the voltage level selection signal Vcon[1] output by the voltage level controller 120. In the self-refresh mode, the self-refresh command signal PSELF input into the NAND gate NAND of the mode selector 160 is at a high logic level, so the operation mode selector 160 may output the voltage level selection signal Pself[1] in response to the fuse program of the fuse circuit 125 of the voltage level controller 120.

That is, if the fuse of the fuse circuit 125 of the voltage level controller 120 is blown, i.e., the output selection control signal Vsel[1] is at a high logic level, the operation mode selector 160 outputs the voltage level selection signal Pself[1] of a high level in response to the selection control signal Vsel[1] of a high level and the self-refresh command signal PSELF of a high level. If the fuse of the fuse circuit 125 of the voltage level controller 120 is not blown, i.e., the output selection control signal Vsel[1] is of a low level, the operation mode selector 160 outputs the voltage level selection signal Pself[1] of a low level even in the self-refresh mode.

Similarly, in the normal mode, the second and third voltage level selectors 100-2 and 100-3 may output low-level voltage level selection signals Pself[2] and Pself[3]. In the self-refresh mode, a voltage level controller of each of the second and third voltage level selectors 100-2 and 100-3 may receive a power supply voltage VDD and output a voltage level control signal Vcon[2] or Vcon[3], which may be determined by fuse programming according to the voltage level of a required reference voltage. Thus, a latch unit of each of the second and third voltage level selectors 100-2 and 100-3 may output the selection control signal Vsel [2] or Vsel [3] in response to corresponding voltage level control signals Vcon[2] or Vcon [3]. Thereafter, an operating mode selector of each of the second and third voltage level selectors 100-2 and 100-3 may receive the selection control signal Vsel [2] or Vsel [3] and output a voltage level selection signal Pself[2] or Pself[3] in response to a self-refresh command signal PSELF.

Figure 4:
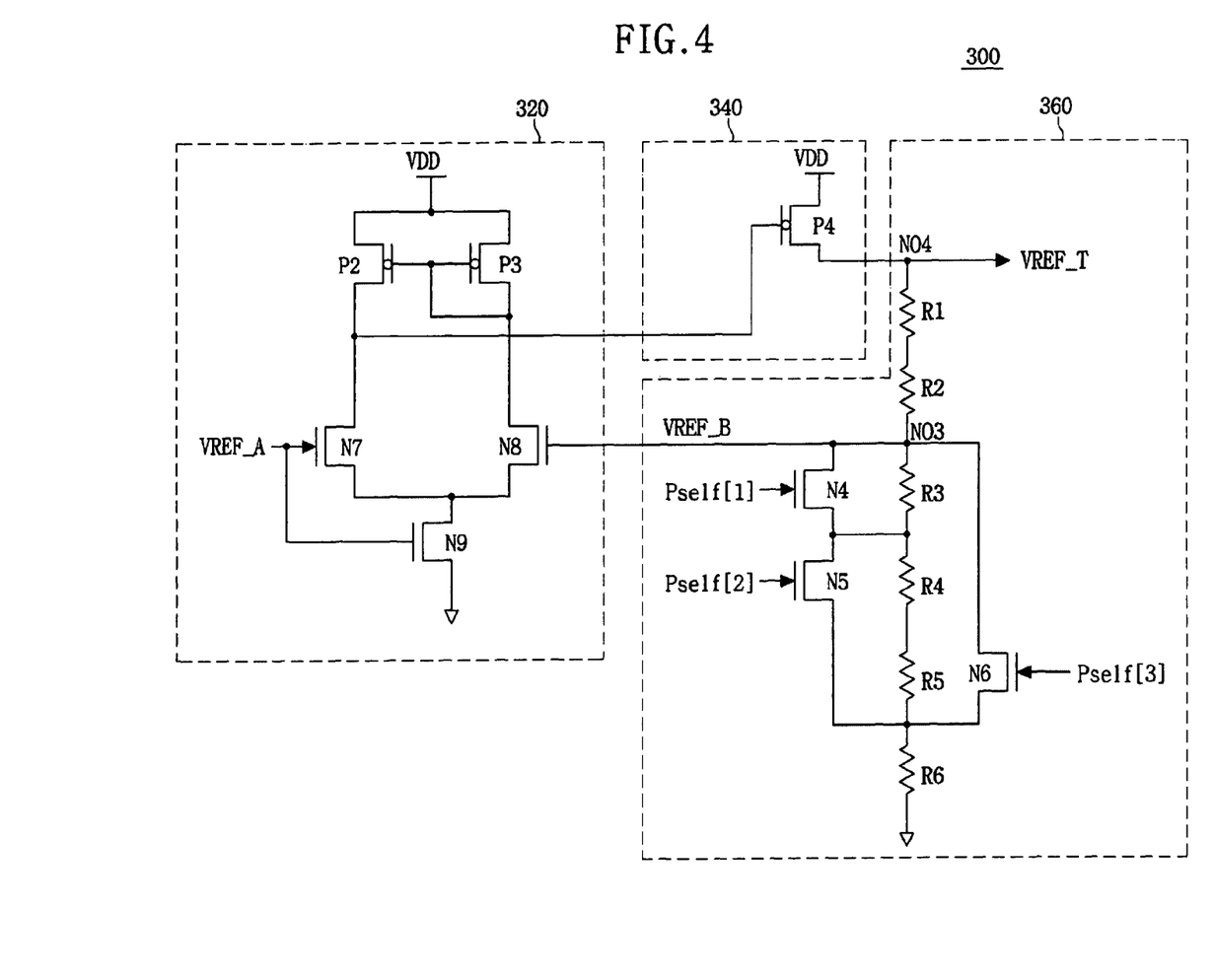
FIG. 4 illustrates a block diagram of a reference voltage generator of the semiconductor memory device shown in FIG. 2.

FIG. 4 illustrates a block diagram of the reference voltage generator 300 of the semiconductor memory device shown in FIG. 2. Referring to FIG. 4, the reference voltage generator 300 may be configured to include a differential amplifier 320, an output unit 340, and a voltage level controller 360. The differential amplifier 320 may be configured to include two PMOS transistors P2 and P3 and three NMOS transistors N7, N8, and N9, and the output unit 340 may be configured to include a PMOS transistor P4.

Referring to FIG. 4, in the differential amplifier 320, the PMOS transistor P2 and the NMOS transistor N7, which are connected in series, may be connected in parallel to the PMOS transistor P3 and the NMOS transistors N8, which are connected in series. An external power supply voltage VDD may be applied to a point of contact between source terminals of the PMOS transistors P2 and P3, and a ground voltage may be applied through the NMOS transistor N9 to a point of contact between the NMOS transistors N7 and N8.

A first reference voltage VREF_A and a second reference voltage VREF_B may be applied to gate terminals of the NMOS transistors N7 and N8, respectively, and gate terminals of the PMOS transistors P2 and P3 may be connected to each other and to a point of contact between the PMOS transistor P3 and the NMOS transistor N8. Functions of respective blocks will now be described with reference to FIG. 4.

The differential amplifier 320 may receive the first reference voltage VREF_A and the second reference voltage VREF_B. The differential amplifier 320 may output a differentially amplified voltage corresponding to a difference between the first and second reference voltages VREF_A and VREF_B to the gate of the PMOS transistor P4 of the output unit 340.

In the output unit 340, the PMOS transistor P4 may receive the external power supply voltage VDD through a source terminal thereof and may transmit the external power supply voltage VDD through a drain terminal, i.e., a node N04, to an output of the voltage level controller 360 as a target reference voltage VREF_T. IN other words, the target reference voltage VREF_T may be output through the node N04 in response to the differentially amplified voltage applied to the gate terminal of the PMOS transistor P4 of the output unit 340 by the differential amplifier 320.

The voltage level controller 360 may receive the target reference voltage VREF_T from the output unit 340 and the plurality of voltage level selection signals Pself from the voltage level selector unit 100. The voltage level controller 360 may divide the target reference voltage VREF_T in response to the plurality of voltage level selection signals Pself[3:1] to output a corresponding second reference voltage VREF_B to the differential amplifier 320.

Figure 5:
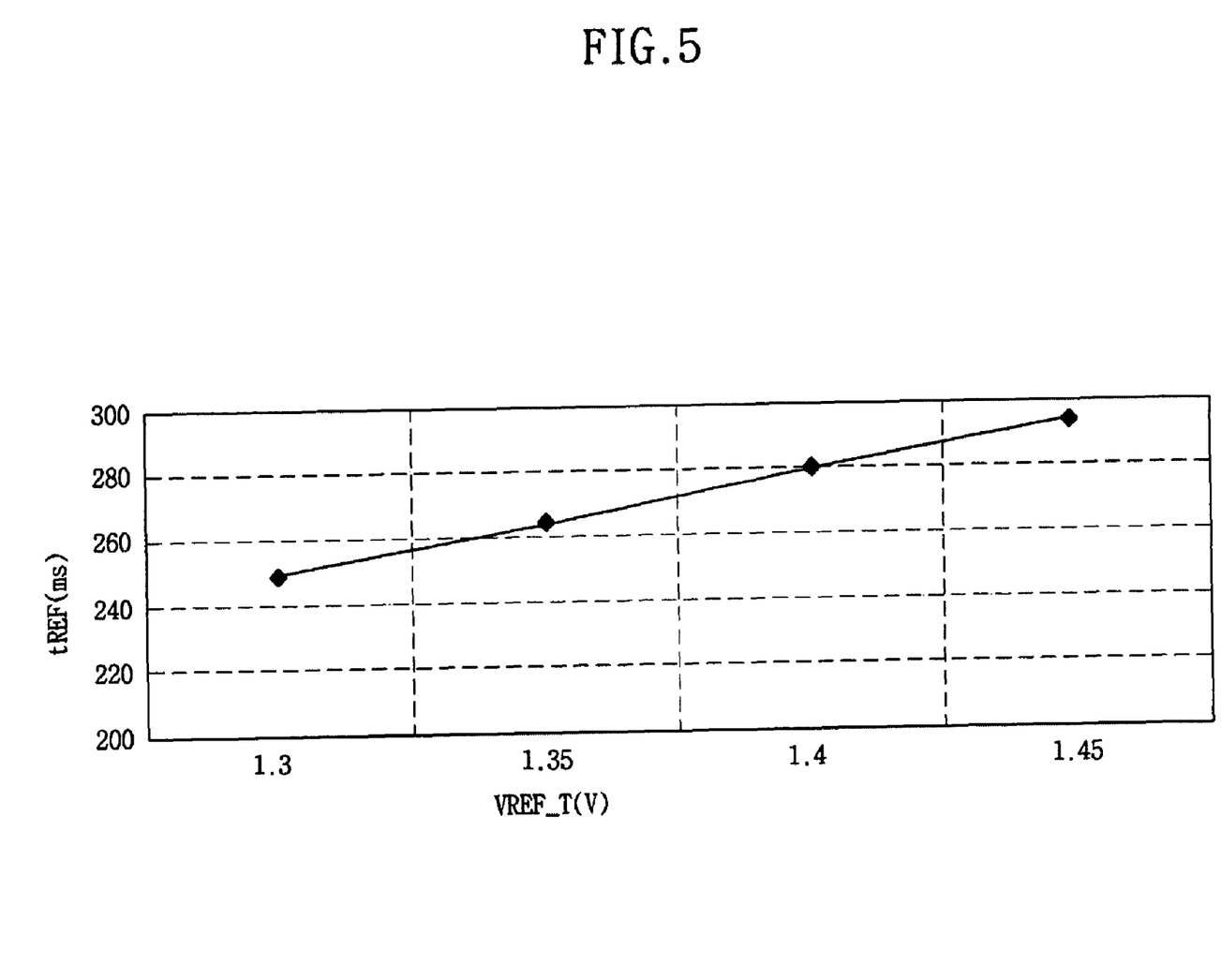
FIG. 5 illustrates a graph of self-refresh characteristics of the reference voltage generator shown in FIG. 4.

FIG. 5 illustrates a graph of self-refresh characteristics of the semiconductor memory device. In FIG. 5, an abscissa denotes absolute values of a target reference voltage VREF_T, and an ordinate denotes a maximum self-refresh period tREF.

Referring to FIG. 5, when the target reference voltage VREF_T is about 1.3 V, 1.35 V, 1.4 V, and 1.45 V, corresponding values of maximum self-refresh period tREF are about 250 ms, 265 ms, 280 ms, and 295 ms. From the above result, it can be seen that each time the target reference voltage VREF_T increases by about 0.05V, the maximum self-refresh period tREF increases by about 15 ms. In other words, as the absolute value of the target reference voltage VREF_T increases, the self-refresh characteristics of the semiconductor memory device improve.

Operation of the reference voltage generator 300 of the semiconductor device according to the present example embodiment will now be described with reference to FIGS. 2 through 5.

In a normal mode, since the voltage level selection unit 100 outputs all the three voltage level selection signals Pself[3:1] at a low level, all the NMOS transistors N4 to N6 may be turned off in response to the three voltage level selection signals Pself[3:1] applied to gate terminals thereof. Thus, a voltage value of VREF_T*(R3+R4+R5+R6)/(R1+R2+R3+R4+R5+R6) may be output through a node NO3 as the second reference voltage VREF_B according to the voltage divider rule. When resistances of the resistors R1, R2, R3, R4, R5, and R6 and a level of the first reference voltage VREF_A are appropriately set, the reference voltage generator 300 may be configured to output the target reference voltage VREF_T of the first reference voltage level, e.g., about 1.3 V, in the normal mode.

In the self-refresh mode, when a required target reference voltage VREF_T is about 1.35 V, the voltage level selection unit 100 may be configured to output the first voltage level selection signal Pself[1] at a high level and output the remaining voltage level selection signals Pself[2] and Pself[3] at a low level based on fuse programming. In this case, only the NMOS transistor N4 may be turned on, while the remaining NMOS transistors N5 and N6 may be turned off. As a result, voltage having a level of VREF_T*(R4+R5+R6)/(R1+R2+R4+R5+R6) may be output through the node N03 as the second reference voltage VREF_B according to the voltage divider rule.

That is, when the voltage level selection unit 100 outputs the voltage level selection signal Pself[1] of a high level and the voltage level selection signals Pself[2] and Pself[3] of a low level in the self-refresh mode according to the fuse programming, the reference voltage generator 300 may output the target reference voltage VREF_T of a second reference voltage level, e.g., 1.35 V, which is higher than the first reference voltage level, e.g., 1.3 V.

Similarly, when the target reference voltage VREF_T required in the self-refresh mode is about 1.4 V or 1.45 V, the voltage level selection unit 100 may be configured to output a second or third voltage level selection signal Pself[2] or Pself[3] at a high level and output the remaining voltage level selection signals Pself[1] and Pself[3] or Pself[1] and Pself[2] at a low level based on fuse programming. In each case, only the NMOS transistor N5 or the NMOS transistor N6 may be turned on, respectively, while the remaining NMOS transistors N4 and N6 or N4 and N5 may be turned off, respectively. As a result, in each case, a second reference voltage VREF_B having a level of VREF_T*(R3+R6)/(R1+R2+R3+R6) or VREF_T*(R6)/(R1+R2+R6), respectively, may be output through the node N03 according to the voltage divider rule.

When the voltage level selection unit 100 is configured to output only the voltage level selection signal Pself[2] at a high level in the self-refresh mode according to the fuse program, the reference voltage generator 300 may output the target reference voltage VREF_T of a third reference voltage level, e.g., 1.4 V, which is higher than the first reference voltage level, e.g., 1.3 V, and the second reference voltage level, e.g., 1.35 V. Further, when the voltage level selection unit 100 is configured to output only the voltage level selection signal Pself[3] at a high level in the self-refresh mode according to the fuse program, the reference voltage generator 300 may output the target reference voltage VREF_T of a fourth reference voltage level, e.g., 1.45 V, which is higher than the first reference voltage level, e.g., 1.3 V, the second reference voltage level, e.g., 1.35 V, and the third reference voltage level, e.g., 1.4 V.

When the target reference voltage VREF_T is increased, a cell plate voltage VCP, i.e., an internal voltage applied to a second terminal of a cell capacitor of a memory cell, may increase and a number of charges of the cell capacitor, e.g., the cell capacitor 30 of FIG. 1, may increase. As a result, a maximum self-refresh period, which is proportional to the number of charges of the cell capacitor based on the equation tREF=Q/i, may also increase.

The maximum self-refresh period may be used to increase a self-refresh period and to reduce a self-refresh current IDD. As a result, as illustrated in FIG. 5, when a target reference voltage VREF_T is set as about 1.3 V, the self-refresh period is about 250 ms. However, when the target reference voltage VREF_T is set to about 1.45 V, the self-refresh period may increase to about 295 ms.

Accordingly, as compared with the normal mode when the target reference voltage VREF_T is relatively low, e.g., about 1.3 V, in the self-refresh mode when the target reference voltage VREF_T increases, e.g., reaches a predetermined high level of about 1.45 V, the self-refresh period may increase by as much as 45 ms. Therefore, a number of times a self-refresh operation is performed may be reduced.

As described above, the reference voltage generator 300 of the semiconductor memory device according to the present example embodiment may set a reference voltage having a different voltage level in the self-refresh mode than in the normal mode so as to control a final target reference voltage. As a result, the number of times the self-refresh operation is performed may be decreased, thereby reducing operating power, i.e., power consumption, of the semiconductor memory device.

Figure 6:
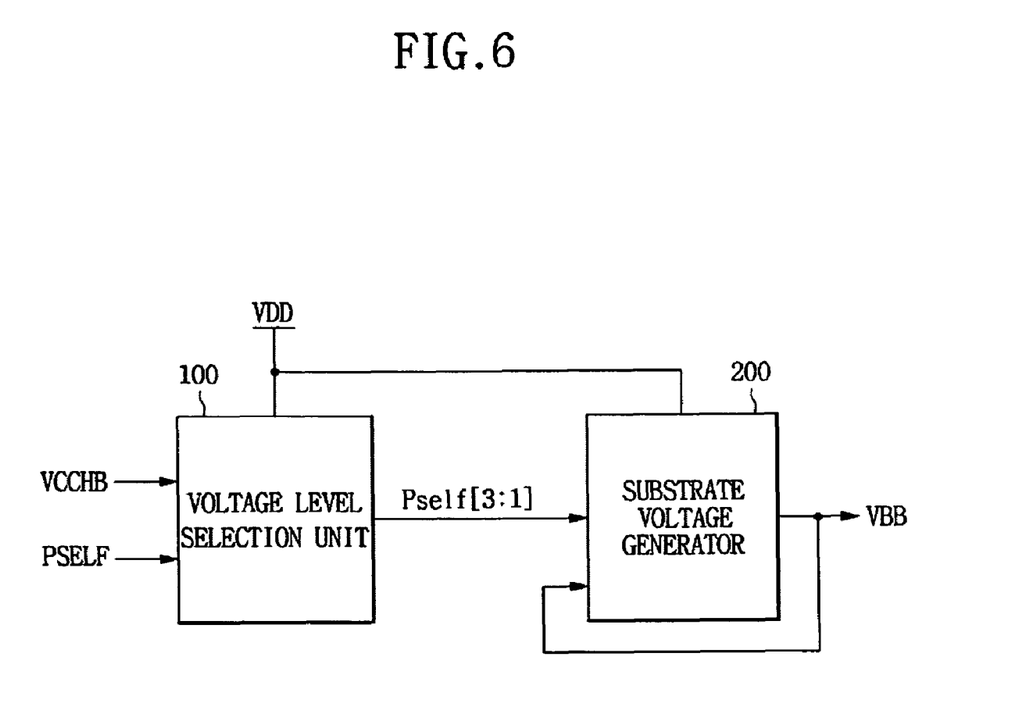
FIG. 6 illustrates a block diagram of a portion of a semiconductor memory device according to another example embodiment.

FIG. 6 illustrates a block diagram of a portion of a semiconductor memory device according to another example embodiment. The semiconductor memory device may include a voltage level selection unit 100 and a substrate voltage generator 200. Functions of some blocks of the semiconductor memory device according to the present example embodiment will now be described with reference to FIG. 6.

It is noted that function and operation of the voltage level selection unit 100 in the semiconductor memory device of FIG. 6 is substantially the same as in the semiconductor memory device of FIG. 2, and therefore, a detailed description thereof will not be repeated. It is further noted that the voltage level controller 120 in the semiconductor memory device of FIG. 6 receives a power supply voltage VDD and outputs a corresponding voltage level control signal Vcon[1] according to a voltage level of a substrate voltage, as opposed to the voltage level of a reference voltage VREF_A.

Referring to FIG. 6, the substrate voltage generator 200 may receive a fed-back substrate voltage VBB, may detect if the substrate voltage VBB reaches a predetermined substrate voltage level in response to the plurality of voltage level selection signals Pself[3:1], may pump charges until the substrate voltage VBB reaches a target substrate voltage level according to a normal mode or a self-refresh mode, and may generate different substrate voltages VBB. The substrate voltage generator 200 will be described in more detail below with reference to FIG. 7.

Figure 7:
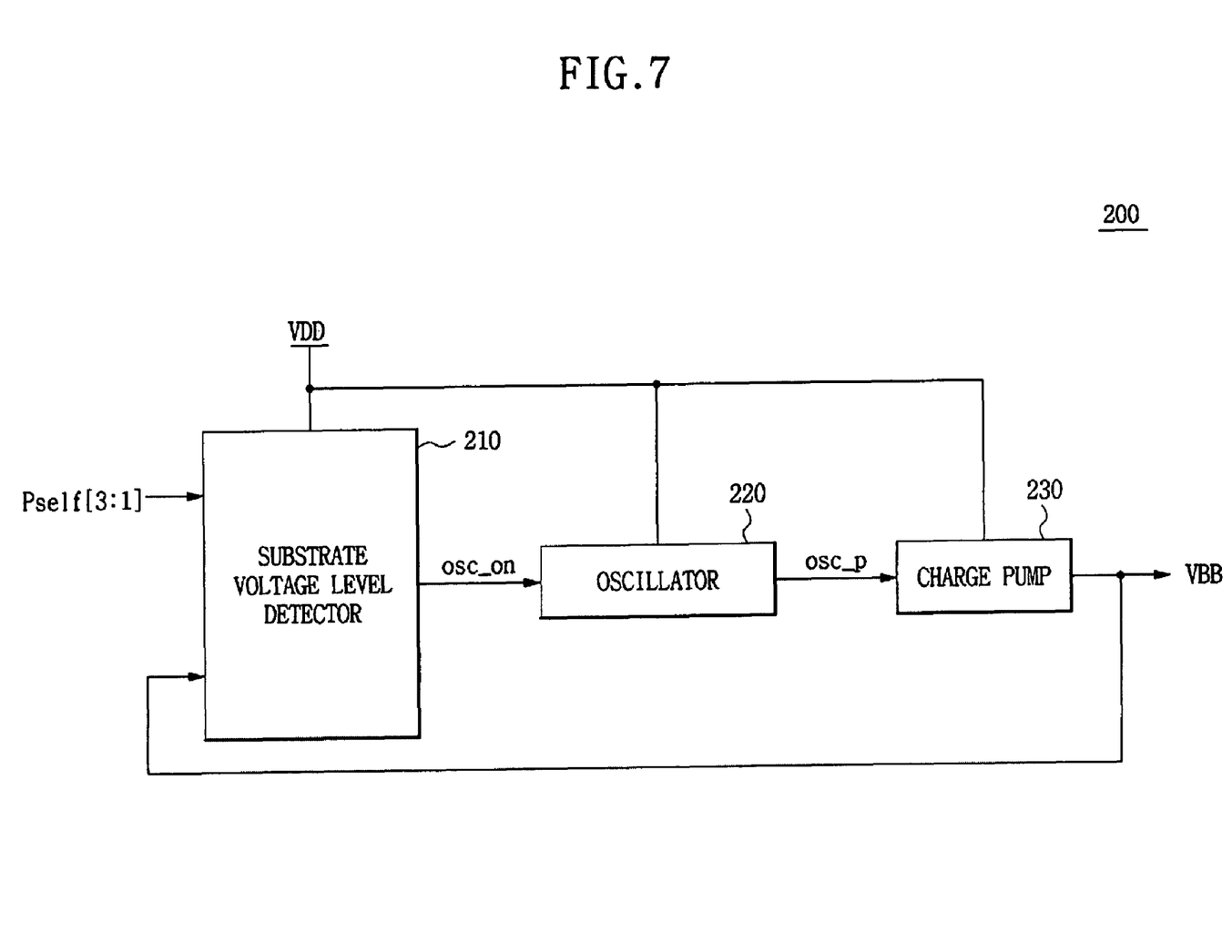
FIG. 7 illustrates a block diagram of a substrate voltage generator of the semiconductor memory device shown in FIG. 6.

FIG. 7 illustrates a block diagram of the substrate voltage generator 200 of the semiconductor memory device shown in FIG. 6. As illustrated in FIG. 7, the substrate voltage generator 200 may include a substrate voltage level detector 210, an oscillator 220, and a charge pump 230. Functions of respective blocks will now be described with reference to FIG. 7.

The substrate voltage level detector 210 may receive the plurality of voltage level selection signals Pself[3:1] from the voltage level selection unit 100 and the fed-back substrate voltage VBB. The substrate voltage level detector 210 may detect if the substrate voltage VBB reaches a predetermined target value in response to the plurality of voltage level selection signals Pself[3:1], and may output a corresponding oscillator-on signal osc_on to control operation of the oscillator 220.

The oscillator 220 may receive the signal osc_on from the substrate voltage level detector 210, and may periodically generate a pulse signal osc_p in response to the oscillator-on signal osc_on.

The charge pump 230 may receive the pulse signal osc_p from the oscillator 220. The charge pump 230 may pump charges in response to the pulse signal osc_p until the substrate voltage VBB reaches a target substrate voltage level according to a normal mode or a self-refresh mode, and may output the new substrate voltage VBB, i.e., the substrate voltage VBB after reaching the target substrate voltage level.

Figure 8:
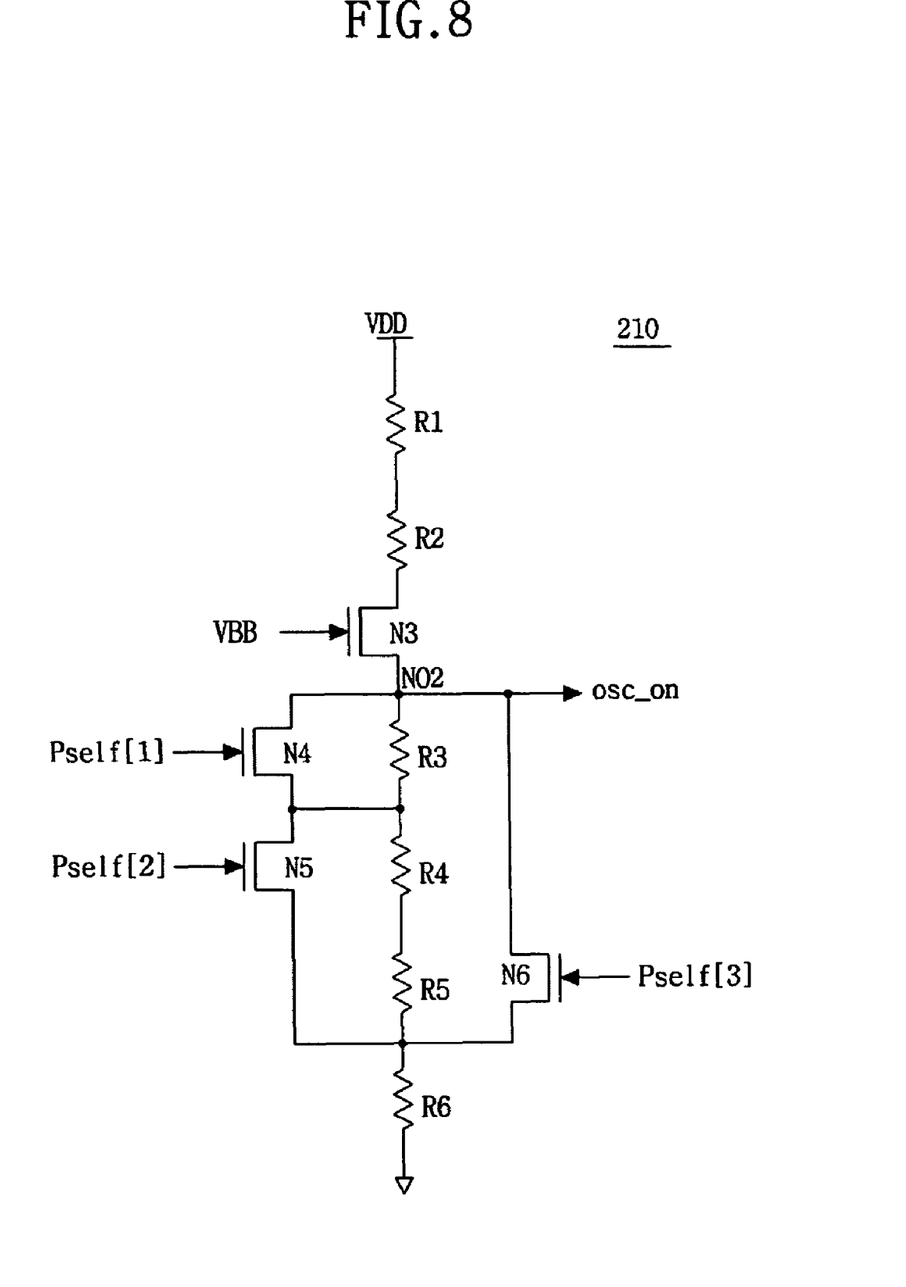
FIG. 8 illustrates a circuit diagram of a substrate voltage level detector of the substrate voltage generator shown in FIG. 7.

FIG. 8 illustrates a circuit diagram of the substrate voltage level detector 210 of the substrate voltage generator 200 shown in FIG. 7. The substrate voltage level detector 210 may include six resistors R1 to R6 and four NMOS transistors N3 to N6.

The first and second resistors R1 and R2, the NMOS transistor N3, and the third through sixth resistors R3 to R6 may be sequentially connected in series, so that an external power supply voltage VDD may be applied to a first terminal of the serial connection and a ground voltage may be connected to a second terminal thereof. As illustrated in FIG. 8, both terminals of the NMOS transistor N4 may be respectively connected to both terminals of the third resistor R3, both terminals of the NMOS transistor N5 may be respectively connected to both terminals of a series of fourth and fifth resistors R4 and R5, and both terminals of the NMOS transistor N6 may be respectively connected to both terminals of a series of the third through sixth resistors R3 to R6.

Figure 9:
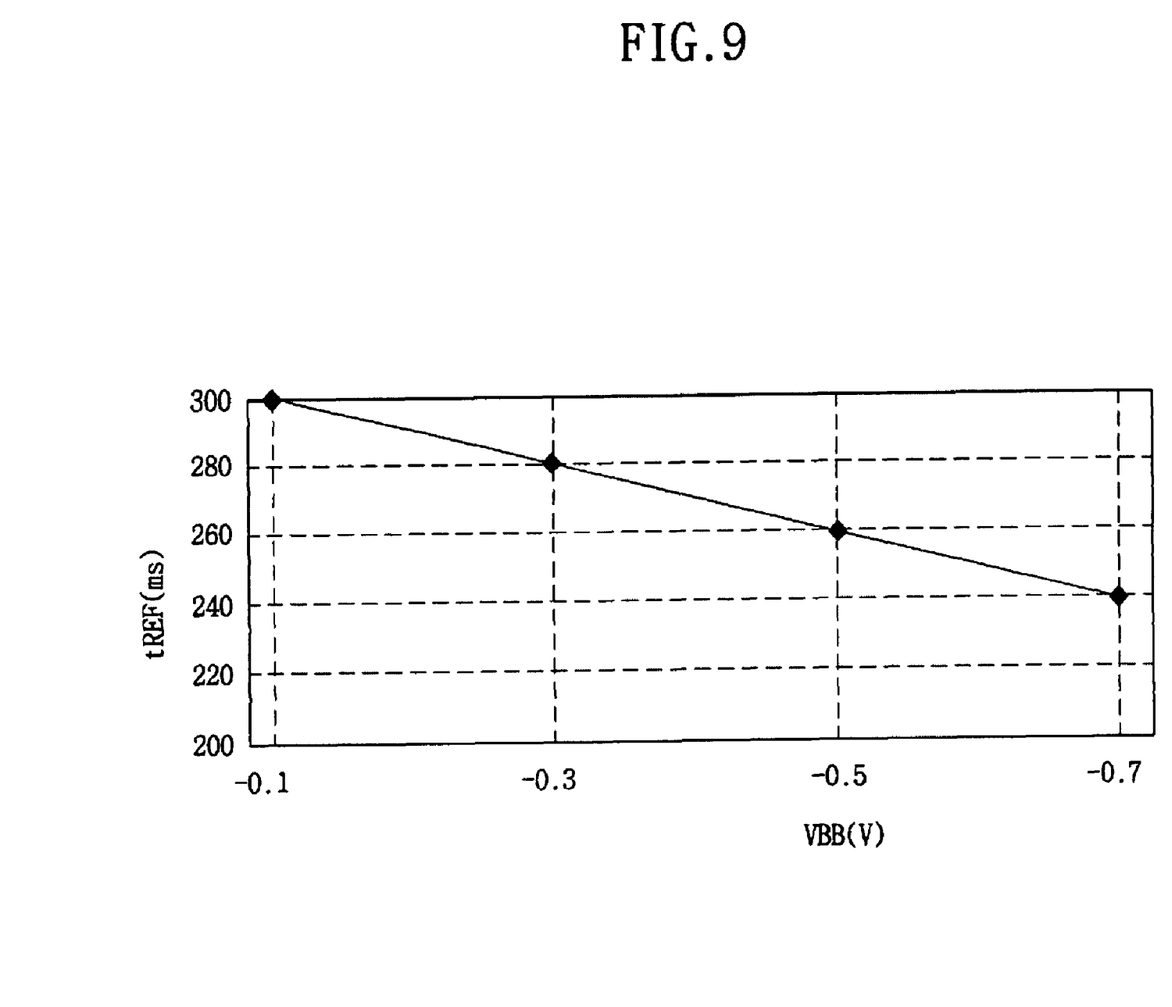
FIG. 9 illustrates a graph of self-refresh characteristics of the substrate voltage generator shown in FIG. 7.

FIG. 9 illustrates a graph of self-refresh characteristics of the substrate voltage generator 200 shown in FIG. 7. In FIG. 9, an abscissa denotes a substrate voltage VBB, and an ordinate denotes a maximum self-refresh period tREF.

Referring to FIG. 9, when the substrate voltage VBB is about (−0.7) V, (−0.5) V, (−0.3) V, and (−0.1) V, the maximum self-refresh period tREF may reach 240 ms, 260 ms, 280 ms, and 300 ms, respectively. From the above result, it may be seen that each time the absolute value of the substrate voltage VBB decreases by as much as about 0.2 V, the maximum self-refresh period tREF decreases by as much as about 20 ms. In other words, as the absolute value of the substrate voltage VBB decreases, the self-refresh characteristics of the semiconductor memory device improve.

Operation of the substrate voltage level detector 210 of the substrate voltage generator 200 according to the present example embodiment will now be described with reference to FIGS. 8 and 9.

In a normal mode, since the voltage level selection unit 100 outputs all the three voltage level selection signals Pself[3:1] at a low level, all the NMOS transistors N4 through N6 may be turned off. As a result, a voltage level at a node N02 may equal VDD*(R3+R4+R5+R6)/(R1+R2+R3+R4+R6+R(N3)) according to the voltage divider rule, so an oscillator-on signal osc_on output by the substrate voltage level detector 210, i.e., an output terminal of the substrate voltage level detector 210, may equal the voltage level of the node N02. Here, R(N3) represents resistances between both terminals of the NMOS transistor N3.

That is, when the substrate voltage VBB is raised, the resistance R(N3) of the NMOS transistor N3 decreases. Thus, a voltage level of the oscillator-on signal osc_on increases. When a voltage level of the oscillator-on signal osc_on increases, a frequency of the pulse signal osc_p output from the oscillator 220 increases, so a voltage of the substrate voltage VBB output from the charge pump 230 may drop. On the other hand, when the substrate voltage VBB drops, the resistance R(N3) of the NMOS transistor N3 increases, so that a level of the substrate voltage VBB output from the charge pump 230 may increase.

When resistances of the resistors R1, R2, R3, R4, R5, and R6 are appropriately set, the substrate voltage generator 200 may be configured to output the substrate voltage VBB of a first substrate voltage level, e.g., (−0.7) V in the normal mode.

When a substrate voltage VBB required in the self-refresh mode is (−0.5) V, the voltage level selection unit 100 may be configured to output a first voltage level selection signal Pself[1] at a high level and output the remaining voltage level selection signals Pself[2] and Pself[3] at a low level based on fuse programming. In this case, the NMOS transistor N4 may be turned on, and the remaining NMOS transistors N5 and N6 may be turned off.

As a result, the oscillator-on signal osc_on output through node N02 may have a voltage level of VDD*(R4+R5+R6)/(R1+R2+R4+R5+R6+R(N3)) according to the voltage divider rule. Therefore, a level of the substrate voltage VBB at which the substrate voltage generator 200 can become a normal state may be raised.

That is, when the voltage level selector 100 is configured to output the voltage level selection signal Pself[1] of a high level and the voltage level selection signals Pself[2] and Pself[3] of a low level in the self-refresh mode according to the fuse program, the substrate voltage generator 200 may output the substrate voltage VBB of a second substrate voltage level, e.g., (−0.5) V, which is higher than the first substrate voltage level, e.g., (−0.7) V in response to the voltage level selection signals Pself[3:1].

Similarly, when a substrate voltage VBB required in the self-refresh mode is about (−0.3) V or about (−0.1) V, the voltage level selection unit 100 may be configured to output a second or third voltage level selection signal Pself[2] or Pself[3] at a high level and output the remaining voltage level selection signals Pself[1] and Pself[3] or Pself[1] and Pself[2] at a low level based on fuse programming. In this case, only the NMOS transistor N5 or the NMOS transistor N6 may be turned on, while the remaining NMOS transistors N4 and N6 or N4 and N5 may be turned off. As a result, an oscillator-on signal osc_on having a voltage level of VDD*(R3+R6)/(R1+R2+R3+R6+R(N3)) or VDD*(R6)/(R1+R2+R6+R(N3)) may be output through the node N02, which is the output terminal of the substrate voltage level detector 210, according to the voltage divider rule.

That is, when the voltage level selector 100 outputs only the voltage level selection signal Pself[2] at a high level in the self-refresh mode according to the fuse program, the substrate voltage generator 200 may output the substrate voltage VBB of a third substrate voltage level, e.g., (−0.3) V, which is higher than the first substrate voltage level, e.g., (−0.7) V, and the second substrate voltage level, e.g., (−0.5) V, in response to the voltage level selection signal Pself[3:1] in the self-refresh mode. Further, when the voltage level selector 100 outputs only the voltage level selection signal Pself[3] at a high level in the self-refresh mode according to the fuse program, the substrate voltage generator 200 may output the substrate voltage VBB of a fourth substrate voltage level, e.g., (−0.1) V, which is higher than the first substrate voltage level, e.g., (−0.7) V, the second substrate voltage level, e.g., (−0.5) V, and the third substrate voltage level, e.g., (−0.3) V, in response to the voltage level selection signal Pself[3:1] in the self-refresh mode.

When the substrate voltage VBB applied to a bulk terminal of a cell transistor of a memory cell, e.g., the cell transistor 10 of FIG. 1, is raised, a potential difference between both terminals of a PN junction of the cell transistor and a leakage current affected by the potential difference may be reduced. Therefore, the maximum self refresh period, which is inversely proportional to the leakage current of the cell transistor based on the equation tREF=Q/i, may increase.

The ensured maximum self refresh period may be used to increase a self-refresh period in order to reduce a self-refresh current IDD. As a result, as illustrated in FIG. 9, when a substrate voltage VBB, e.g., about (−0.7) V, whose absolute value is higher than a threshold voltage of the NMOS transistor NM1 is applied, the self-refresh period tREF is about 240 ms. However, when a substrate voltage VBB, e.g., about (−0.1) V, whose absolute value is lower than the threshold voltage of the NMOS transistor NM1 is applied, the self-refresh period tREF increases to about 300 ms.

Accordingly, compared with the normal mode when the substrate voltage VBB whose absolute value is higher than the threshold voltage of the NMOS transistor NM1, in the self-refresh mode when the substrate voltage VBB whose absolute value is lower than the threshold voltage of the NMOS transistor NM1 is applied, the self-refresh period tREF may increase so that the number of times a self-refresh operation is performed may be reduced.

As described above, the substrate voltage generator 200 of the semiconductor memory device according to example embodiment may apply a substrate voltage having a different voltage level in the self-refresh mode than in the normal mode so as to control a point in time when the oscillator 220 is driven. As a result, the number of times the self-refresh operation is performed may be lessened, thereby reducing operating power of the semiconductor memory device.

Figure 10:
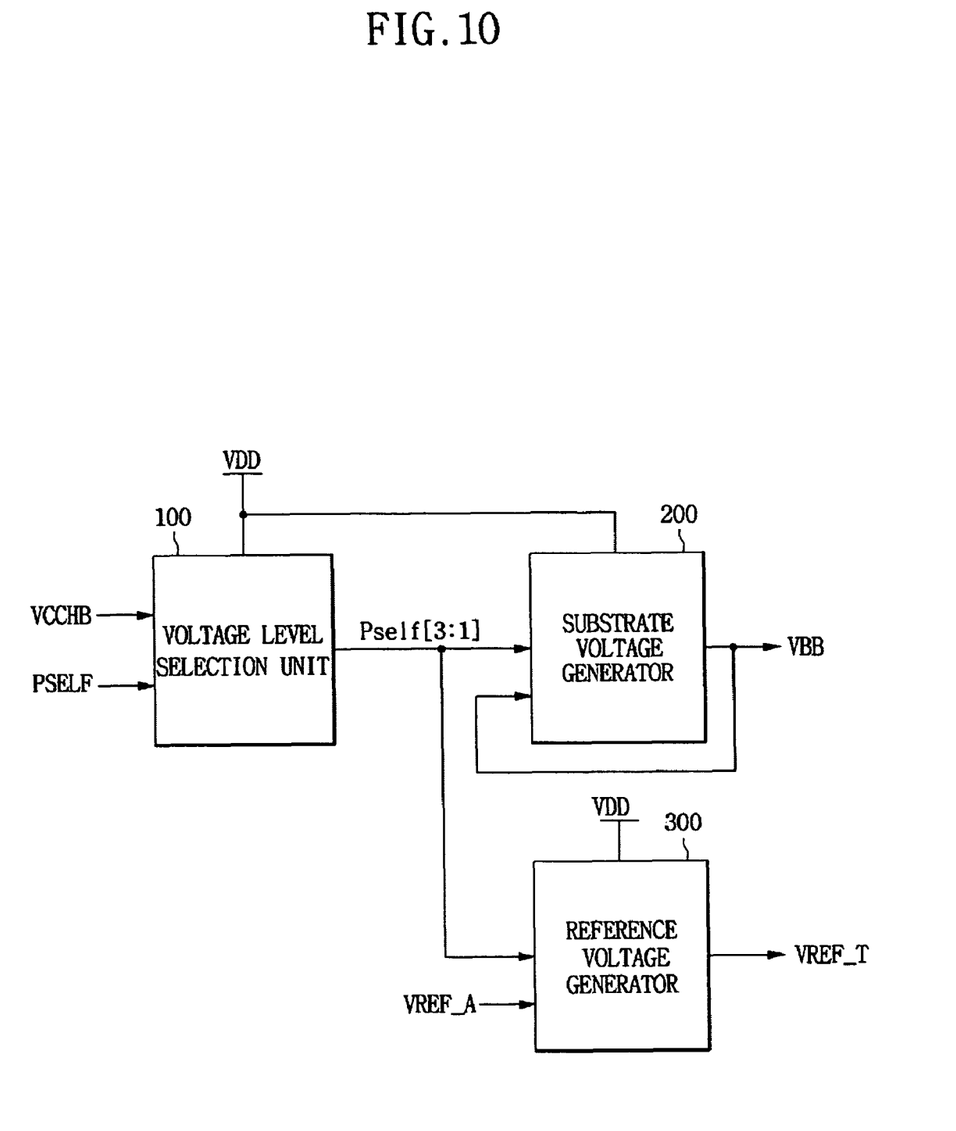
FIG. 10 illustrates a block diagram of a portion of a semiconductor memory device according to still another example embodiment.

FIG. 10 illustrates a block diagram of a portion of a semiconductor memory device according to still another example embodiment. The semiconductor memory device may include the voltage level selection unit 100, the substrate voltage generator 200, and the reference voltage generator 300.

Since functions and operations of some blocks of the semiconductor memory device illustrated in FIG. 10 are substantially the same as those of blocks of the semiconductor memory devices illustrated in FIGS. 4 through 9, a detailed description thereof will be not be repeated.

Referring to FIG. 10, both the substrate voltage generator 200 and the reference voltage generator 300 may receive the plurality of voltage level selection signals Pself[3:1] from the voltage level selection unit 100 and may output different substrate voltages VBB or different target reference voltages VREF_T. Accordingly, in the semiconductor memory device according to the present example embodiment, the substrate voltage generator 200 may output a substrate voltage VBB having a different voltage level to a cell transistor, e.g., the cell transistor 10 of FIG. 1, in the self-refresh mode than in the normal mode to control a point in time when an oscillator is driven, and the reference voltage generator 300 may set a reference voltage having a different voltage level in the self-refresh mode than in the normal mode to control a final target reference voltage, which, in turn, controls the cell plate voltage VCP applied to a cell capacitor, e.g., the cell capacitor 30 of FIG. 1. As a result, the number of times a self-refresh operation is performed may be decreased, thereby reducing operating power of the semiconductor memory device.

As described above, a self-refresh period may be increased in a self-refresh mode so that a number of times a substrate voltage and/or a reference voltage is generated may be reduced. As a result, a self-refresh current can be decreased, thereby reducing a power consumption of a semiconductor memory device.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:
a voltage level selection unit configured to output a plurality of voltage level selection signals according to a fuse program in response to a self-refresh command signal;
a reference voltage generator configured to receive a reference voltage and output a target reference voltage having a different voltage level depending on a normal mode or a self-refresh mode in response to the voltage level selection signals; and
a substrate voltage generator configured to pump charges until a substrate voltage reaches a target substrate voltage level according to the normal mode or the self-refresh mode in response to the voltage level selection signals and to generate a substrate voltage having a different voltage level.

2. The device as claimed in claim 1, further comprising:
a cell transistor having a bulk terminal to which the substrate voltage is applied, a gate terminal connected to a word line, and a first terminal connected to a bit line; and
a cell capacitor having a first terminal connected to a second terminal of the cell transistor and a second terminal applied with a cell plate voltage, the cell plate voltage being generated using the target reference voltage.

3. The device as claimed in claim 2, wherein in the self-refresh mode, an output target reference voltage and an output substrate voltage are higher than in the normal mode.

4. The device as claimed in claim 1, wherein the substrate voltage generator comprises:
a substrate voltage level detector configured to receive a substrate voltage, detect whether the substrate voltage reaches a predetermined target voltage level according to the voltage level selection signals, and output an oscillator on signal;
an oscillator configured to generate a pulse signal having a frequency corresponding to a voltage of the oscillator on signal in response to the oscillator on signal; and
a charge pump configured to receive the pulse signal, and pump charges until the substrate voltage reaches the target voltage level having a different voltage level according to the normal mode or the self-refresh mode to generate the substrate voltage.

5. The device as claimed in claim 4, wherein first to third voltage level selection signals are provided as the plurality of voltage level selection signals, and the substrate voltage level detector comprises:
seventh and eighth resistors which are serially connected between a terminal to which the external power supply voltage and a first node;
a ninth NMOS transistor which is connected between the first node and a second node through which the oscillator on signal is output and has a gate terminal to which the substrate voltage is applied;
ninth to twelfth resistors which are serially connected between the second node and a terminal to which a ground voltage is applied;
a tenth NMOS transistor connected in parallel to the ninth resistor and configured to short-circuit both terminals of the ninth resistor in response to the first voltage level selection signal applied to a gate terminal thereof;
an eleventh NMOS transistor connected in parallel to the tenth and eleventh resistors which are serially connected to each other and configured to short-circuit both terminals of the tenth and eleventh resistors in response to the second voltage selection signal applied to a gate terminal thereof; and
a twelfth NMOS transistor connected in parallel to ninth through eleventh resistors which are serially connected to each other and configured to short-circuit both terminals of the ninth through eleventh resistors in response to the third voltage level selection signal applied to a gate terminal thereof.

6. The device as claimed in claim 5, wherein the substrate voltage level detector receives the first to third voltage level selection signals of a low level, turns off the tenth through twelfth NMOS transistors, and generates the oscillator on signal using the ninth NMOS transistor and the ninth to twelfth resistors in the normal mode, and
the substrate voltage level detector controls on/off operations of the tenth through twelfth NMOS transistors in response to the first to third voltage level selection signals which have different levels depending on a level of the target substrate voltage, and generates the oscillator on signal using the ninth NMOS transistor and some resistors of the ninth to twelfth resistors in the self-refresh mode.

7. The device as claimed in claim 1, wherein the voltage level selection unit has a plurality of voltage level selectors, each voltage level selector includes:
a voltage level controller configured to receive an external power supply voltage and output a voltage level control signal based on fuse programming;
a latch unit configured to latch the voltage level control signal and output a selection control signal in response to the voltage level control signal; and
an operating mode selector configured to output the voltage level selection signal in response to the selection control signal and the self-refresh command signal.

8. A semiconductor memory device, comprising:
a voltage level selection unit configured to output a plurality of voltage level selection signals according to a fuse program in response to a self-refresh command signal; and
a reference voltage generator configured to receive a reference voltage and output a target reference voltage having a different voltage level depending on a normal mode or a self-refresh mode in response to the voltage level selection signals,
wherein the voltage level selection unit has a plurality of voltage level selectors, each voltage level selector including:
a voltage level controller configured to receive an external power supply voltage and output a voltage level control signal based on fuse programming,
a latch unit configured to latch the voltage level control signal and output a selection control signal in response to the voltage level control signal, and
an operating mode selector configured to output the voltage level selection signal in response to the selection control signal and the self-refresh command signal, and wherein the voltage level controller includes:
a first PMOS transistor configured to receive the external power supply voltage through a first terminal thereof and transmit the external power supply voltage through a second terminal thereof in response to a power-up signal applied to a gate terminal thereof,
a fuse circuit configured to be connected between the second terminal of the first PMOS transistor and a first node through which the voltage level control signal is output, the fuse circuit including a fuse configured to blow off according to the fuse program, and
a first NMOS transistor configured to receive a ground voltage through a first terminal thereof and transmit the ground voltage through the first node in response to the power-up signal applied to a gate terminal thereof.

9. A semiconductor memory device, comprising:
a voltage level selection unit configured to output a plurality of voltage level selection signals according to a fuse program in response to a self-refresh command signal; and
a reference voltage generator configured to receive a reference voltage and output a target reference voltage having a different voltage level depending on a normal mode or a self-refresh mode in response to the voltage level selection signals,
wherein the voltage level selection unit has a plurality of voltage level selectors, each voltage level selector including:
a voltage level controller configured to receive an external power supply voltage and output a voltage level control signal based on fuse programming,
a latch unit configured to latch the voltage level control signal and output a selection control signal in response to the voltage level control signal, and
an operating mode selector configured to output the voltage level selection signal in response to the selection control signal and the self-refresh command signal, and
wherein the latch unit includes:
a first inverter configured to receive the voltage level control signal through a first node and to invert the voltage level control signal, the inverted voltage level control signal being output as the selection control signal, and
a second NMOS transistor configured to receive a ground voltage through a first terminal thereof and to transmit the ground voltage to the first node in response to the selection control signal applied to a gate terminal thereof.

10. A semiconductor memory device, comprising:
a voltage level selection unit configured to output a plurality of voltage level selection signals according to a fuse program in response to a self-refresh command signal; and
a reference voltage generator configured to receive a reference voltage and output a target reference voltage having a different voltage level depending on a normal mode or a self-refresh mode in response to the voltage level selection signals,
wherein the voltage level selection unit has a plurality of voltage level selectors, each voltage level selector including:
a voltage level controller configured to receive an external power supply voltage and output a voltage level control signal based on fuse programming,
a latch unit configured to latch the voltage level control signal and output a selection control signal in response to the voltage level control signal, and
an operating mode selector configured to output the voltage level selection signal in response to the selection control signal and the self-refresh command signal, and
wherein the operating mode selector includes:
a NAND gate configured to receive the selection control signal and the self-refresh command signal, and to perform a logic NAND operation on the voltage level control signal and the self-refresh command signal to output a logic NAND signal, and
a second inverter configured to receive the logic NAND signal, and to invert the logic NAND signal to output the voltage level selection signal.

11. A semiconductor memory device, comprising:
a voltage level selection unit configured to output a plurality of voltage level selection signals according to a fuse program in response to a self-refresh command signal; and
a reference voltage generator configured to receive a reference voltage and output a target reference voltage having a different voltage level depending on a normal mode or a self-refresh mode in response to the voltage level selection signals,
wherein the voltage level selection unit has a plurality of voltage level selectors, each voltage level selector including:
a voltage level controller configured to receive an external power supply voltage and output a voltage level control signal based on fuse programming,
a latch unit configured to latch the voltage level control signal and output a selection control signal in response to the voltage level control signal, and
an operating mode selector configured to output the voltage level selection signal in response to the selection control signal and the self-refresh command signal,
wherein the voltage level selection unit is configured to receive the self-refresh command signal of a low level and to output the voltage level selection signal at a low level in the normal mode, and
wherein the voltage level selection unit is configured to output the voltage level selection signal in response to the selection control signal whose output level is determined depending on the self-refresh command signal of a high level and the fuse program in the self-refresh mode.

12. A semiconductor memory device, comprising:
a voltage level selection unit configured to output a plurality of voltage level selection signals according to a fuse program in response to a self-refresh command signal; and
a reference voltage generator configured to receive a reference voltage and output a target reference voltage having a different voltage level depending on a normal mode or a self-refresh mode in response to the voltage level selection signals, the reference voltage generator including:
a differential amplifier configured to receive first and second reference voltages and output a differentially amplified voltage corresponding to a difference in voltage level between the first and second reference voltages,
a second PMOS transistor configured to receive an external power supply voltage through a first terminal thereof and to transmit the external power supply voltage through a second terminal thereof to output the target reference voltage in response to the differentially amplified voltage applied to a gate terminal thereon, and a voltage level controller configured to receive the target reference voltage, and divide the target reference voltage in response to the voltage level selection signals to output the second reference voltage.

13. The device as claimed in claim 12, wherein the differential amplifier includes:

third and fourth PMOS transistors configured to receive the external power supply voltage through first terminals thereof;

a third NMOS transistor configured to receive a ground voltage through a first terminal thereof and to be turned on in response to the first reference voltage applied to a gate terminal thereof; and fourth and fifth NMOS transistors having first terminals connected in common to a second terminal of the third NMOS transistor and configured to be turned on in response to the first and second reference voltages respectively applied to gate terminals thereof, wherein a second terminal of the third PMOS transistor is connected to a second terminal of the fourth NMOS transistor and outputs the differentially amplified voltage, and the second terminal of the third PMOS transistor is connected to a second terminal of the fifth NMOS transistor and connected in common to gate terminals of the third and fourth PMOS transistors.

14. The device as claimed in claim 13, wherein first to third voltage level selection signals are provided as the plurality of voltage level selection signals, and the voltage level controller includes:

first to sixth resistors which are serially connected between a terminal to which the target reference voltage is applied and a terminal to which a ground voltage is applied;

a sixth NMOS transistor connected in parallel to the third resistor and configured to short-circuit both terminals of the third resistor in response to a first voltage level selection signal applied to a gate terminal thereof;

a seventh NMOS transistor connected in parallel to fourth and fifth resistors which are serially connected to each other and configured to short-circuit both terminals of the fourth and fifth resistors in response to a second voltage level selection signal applied to a gate terminal thereof; and an eighth NMOS transistor connected in parallel to third through fifth resistors which are serially connected to each other and configured to short-circuit both terminals of the third through fifth resistors in response to a third voltage level selection signal applied to a gate terminal thereof, wherein the second reference voltage is output from a point of contact between the second and third resistors.

15. The device as claimed in claim 14, wherein the voltage level controller receives the first to third voltage level selection signals of a low level, turns off the sixth through eighth NMOS transistors, and generates the second reference voltage using the first to sixth resistors in the normal mode, and the voltage level controller controls on/off operations of the sixth through eighth NMOS transistors in response to the first to third voltage level selection signals which have difference levels depending on a level of the target reference voltage, and generates the second reference voltage using some of the first to sixth resistors in the self-refresh mode.

16. A semiconductor memory device, comprising:

a voltage level selection unit configured to output a plurality of voltage level selection signals according to a fuse program in response to a self-refresh command signal; and a voltage generator configured to output a target voltage having a different voltage level depending on a normal mode or a self-refresh mode in response to the voltage level selection signals, the voltage generator being a substrate voltage generator configured to pump charges until a substrate voltage reaches a target substrate voltage level according to the normal mode or the self-refresh mode in response to the voltage level selection signals to generate a substrate voltage having a different voltage level and to output the substrate voltage as the target voltage.

17. The device as claimed in claim 16, wherein the substrate voltage generator comprises:

a substrate voltage level detector configured to receive a substrate voltage, detect whether the substrate voltage reaches a predetermined target voltage level according to the voltage level selection signals, and output an oscillator on signal;

an oscillator configured to generate a pulse signal having a frequency corresponding to a voltage of the oscillator on signal in response to the oscillator on signal; and a charge pump configured to receive the pulse signal, and pump charges until the substrate voltage reaches the target voltage level having a different voltage level according to the normal mode or the self-refresh mode to generate the substrate voltage.

* * * * *